(12) United States Patent
Takano et al.

(10) Patent No.: US 7,615,500 B2
(45) Date of Patent: Nov. 10, 2009

(54) METHOD FOR DEPOSITING FILM AND METHOD FOR MANUFACTURING SEMICONDUCTOR DEVICE

(75) Inventors: Kensuke Takano, Kanagawa (JP); Ichiro Yamamoto, Kanagawa (JP); Koji Watanabe, Tokyo (JP)

(73) Assignees: NEC Electronics Corporation, Kawasaki, Kanagawa (JP); NEC Corporation, Tokyo (JP)

( * ) Notice: Subject to any disclaimer, the term of this patent is extended or adjusted under 35 U.S.C. 154(b) by 207 days.

(21) Appl. No.: 11/715,847

(22) Filed: Mar. 9, 2007

(65) Prior Publication Data
US 2007/0212898 A1 Sep. 13, 2007

(30) Foreign Application Priority Data
Mar. 13, 2006 (JP) ............................. 2006-066945

(51) Int. Cl.
*H01L 21/31* (2006.01)
(52) U.S. Cl. .................. 438/775; 438/758; 438/680; 438/785; 438/786; 257/632; 257/E21.267; 257/E21.268; 257/E21.302
(58) Field of Classification Search ................ 438/758, 438/680, 778, 785–786; 257/632, E21.267, 257/E21.268, E21.302
See application file for complete search history.

(56) References Cited

U.S. PATENT DOCUMENTS
2006/0045969 A1* 3/2006 Yamamoto et al. ........ 427/248.1

FOREIGN PATENT DOCUMENTS
JP 2001-35842 2/2001

* cited by examiner

*Primary Examiner*—Davienne Monbleau
*Assistant Examiner*—Hajar Kolahdouzan
(74) *Attorney, Agent, or Firm*—McGinn IP Law Group, PLLC (57) ABSTRACT

A method for depositing a film includes: (a) processing a wafer, including forming a high dielectric constant film on a first wafer; and achieving nitridation of the high dielectric constant film formed on the first wafer; and (b) performing coating process including forming a high dielectric constant film on a second wafer; and achieving nitridation of the high dielectric constant film formed on the second wafer. The processing the wafer and the performing the coating process are carried out in the same reaction chamber. The coating process is carried out before the processing the wafer.

19 Claims, 10 Drawing Sheets

METHOD FOR DEPOSITING FILM AND METHOD FOR MANUFACTURING SEMICONDUCTOR DEVICE

This application is based on Japanese patent application No. 2006-66945, the content of which is incorporated hereinto by reference.

BACKGROUND

1. Technical Field

The present invention relates to a method for depositing a film and a method for manufacturing a semiconductor device.

2. Related Art

A proceeding of higher density device integration leads to a reduction of a gate insulating film thickness of a transistor. With such reduction in film thickness, an increase in gate leakage current is becoming a problem. In order to solve the problem, a method of reducing a leakage current is proposed by employing a high dielectric constant film (high-k film) as a gate insulating film, which allows reducing a physical film thickness while maintaining an electric film thickness.

Japanese Laid-open patent publication No. 2001-35842 (patent document 1) discloses a technology of reducing variations of film thickness occurred in depositing $Ta_2O_5$ or the like. As described in the document, a problem of causing the variations in the deposited film thickness due to a variation of a deposition rate, depending on a stand-by time after the deposition of $Ta_2O_5$ performed right before. The reason is considered that oxygen is eliminated in the stand-by time, and, in turn, when oxygen is introduced in a reaction chamber in the next depositing operation, oxygen is partially consumed on an interior surface of the reaction chamber, and eventually a quantity of oxygen supplied to a wafer is changed.

According to the document, one of solutions for such problem is to supply additional oxygen for compensation. Further, a method for inhibiting a variation in the film thickness by maintaining a pressure within the reaction interior at atmospheric pressure during the stand-by time is also proposed. This method utilizes phenomena that maintaining the pressure in the reaction chamber at a reduced pressure promotes an elimination of oxygen and on the contrary, maintaining the pressure in the reaction chamber at an atmospheric pressure inhibits an elimination of oxygen.

SUMMARY OF THE INVENTION

The gate insulating film is required to have a lower reactivity with the gate electrode disposed thereon and a nature that the film is not crystallized even in a high-temperature annealing process. Typical material that satisfies these needs and is suitable for a practical use includes a nitrided hafnium silicate film (HfSiON). A chemical vapor deposition (CVD) is often employed for depositing the HfSiON film. If a reproducible deposition of the HfSiON film would be achieved in employing a batch CVD apparatus, higher productivity can be assured.

Figure 6:
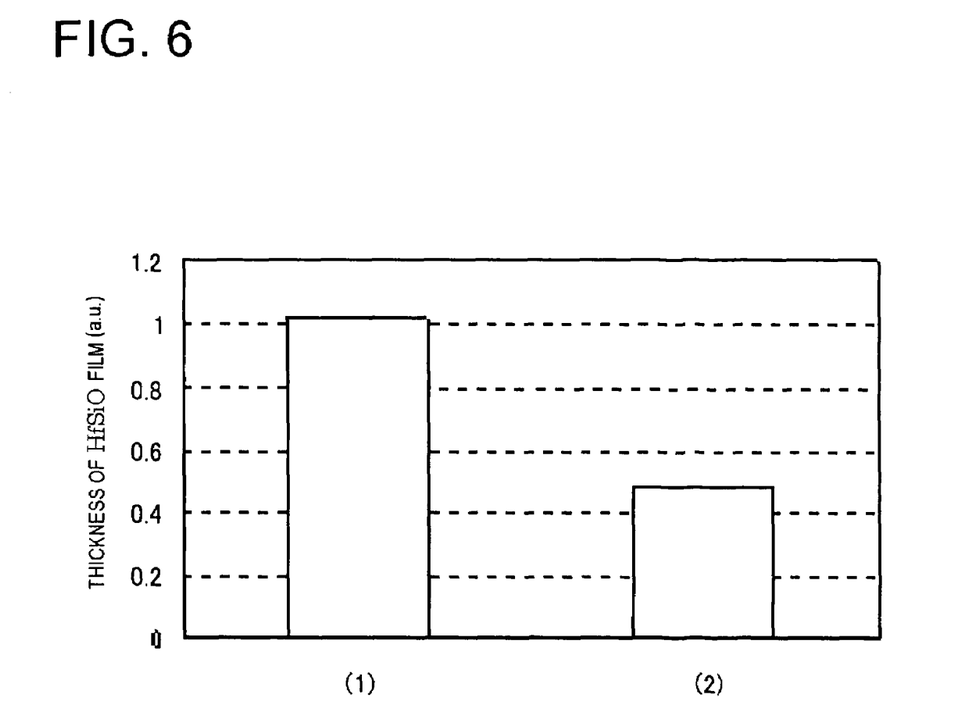
FIG. 6 is a graph, showing a relationship between the type of the previous batch and the deposition rate.
Figure 7:
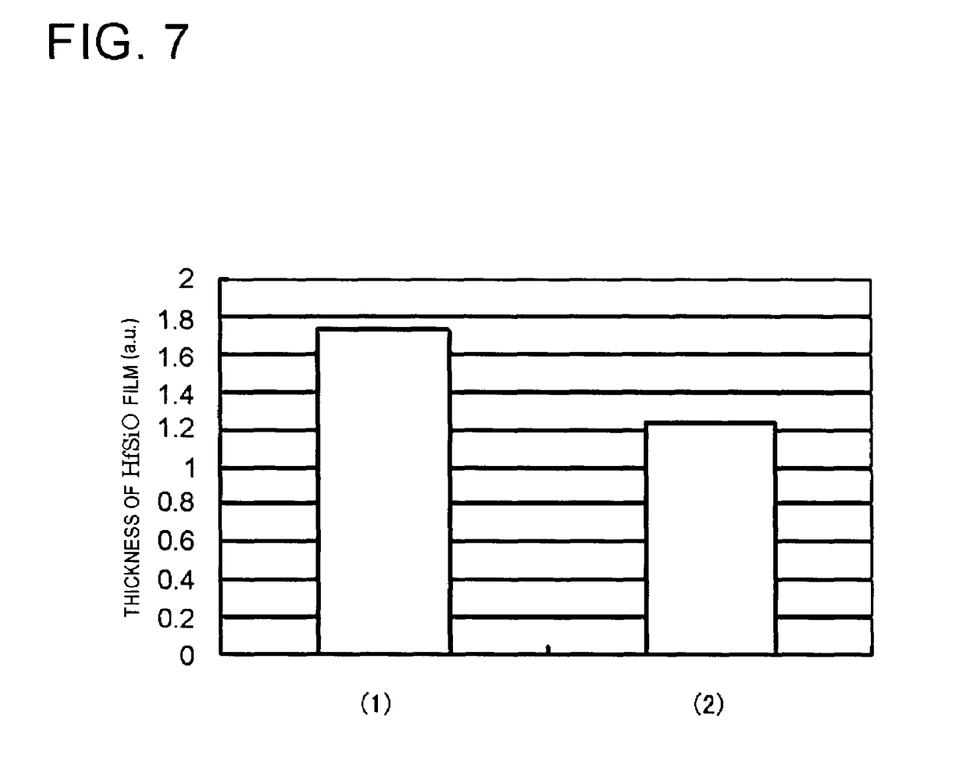
FIG. 7 is a graph, showing a relationship between the type of the facing wafer and the deposition rate.

When deposition and nitridation of hafnium silicate (HfSiO) are sequentially performed in the same reaction chamber in the batch CVD apparatus, a film thickness of a deposited film is generally varied depending on a condition of a nearest preceding batch deposition, as shown in FIG. 6. In the diagram, bar graphs (1) and (2) represent the case where the nearest preceding batch is depositing HfSiO film and annealing in $NH_3$, respectively. The ordinate represents a film thickness (in arbitrary scaling). Further, as shown in FIG. 7, there is a problem of generating some different film thicknesses between the case of using a HfSiO wafer facing to the product wafers as a NPW (bar graph (1)) and the case of using a HfSiON wafer facing to the product wafers as a NPW (bar graph (2)), even if the condition of the nearest preceding batch depositions for these cases are identical. In FIG. 7, the ordinate represents a film thickness (in arbitrary scaling).

These data represent that the deposition rate is affected by surface nitrogen concentration on a reaction chamber interior wall and a facing wafer (i.e. wafer facing to the product wafers as a dummy wafer). Further, it is also considered that a variation in the film thickness among batches is caused since nitrogen concentrations on the reaction chamber interior wall and on the surface of the facing wafer at the starts of respective batches cannot be controlled to be constant. Thus, in order to inhibit the variation in the film thickness, it is required to maintain the surface nitrogen concentration on the interior wall of the reaction chamber and the facing wafer to be constant.

When the idea described in the patent document 1 is to be employed in order to reduce such variation in the film thickness, two approaches are considered: performing anneal in $NH_3$ shortly before the deposition to provide a saturated and identical nitrogen concentrations on the interior wall of the reaction chamber and on the facing wafer; and maintaining the pressure within the reaction chamber at an atmospheric pressure. However, as results of experiments, it was found that the deposition stability cannot be improved by these approaches.

Figure 8A:
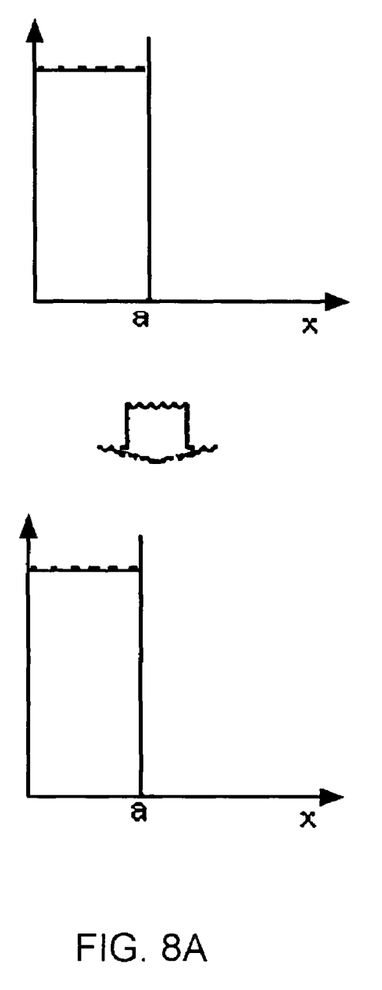
FIGS. 8A and 8B are graphs, useful in describing that a difference in the surface nitrogen concentration is caused by a difference in the nitrogen concentration before the $NH_3$ annealing.
Figure 8B:
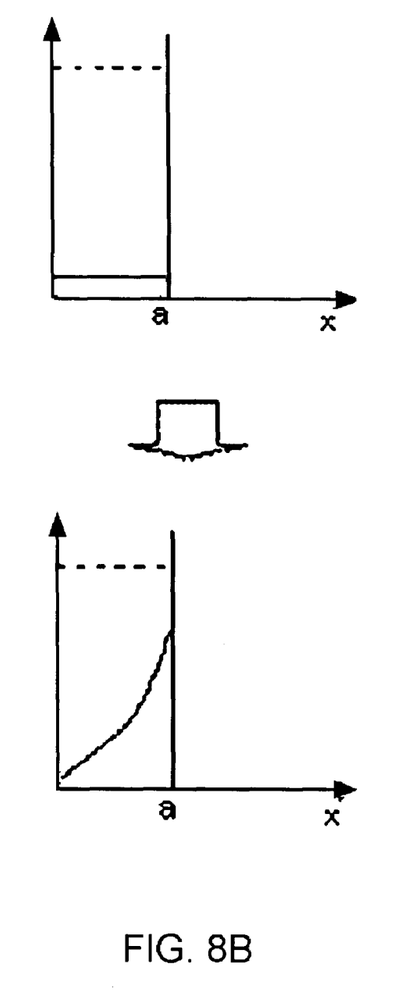
Figure 9A:
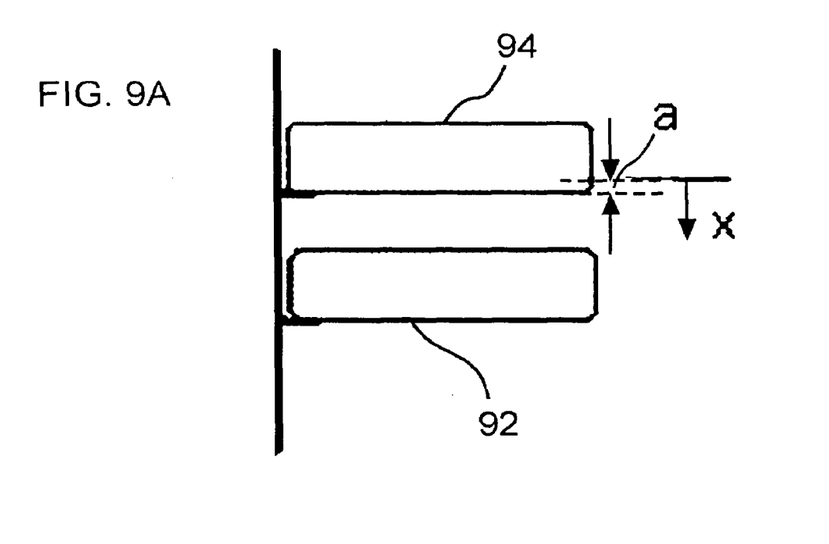
FIG. 9A and FIG. 9B are schematic diagram of the reaction chamber, illustrating the interior wall of the reaction chamber and the facing wafer.
Figure 9B:
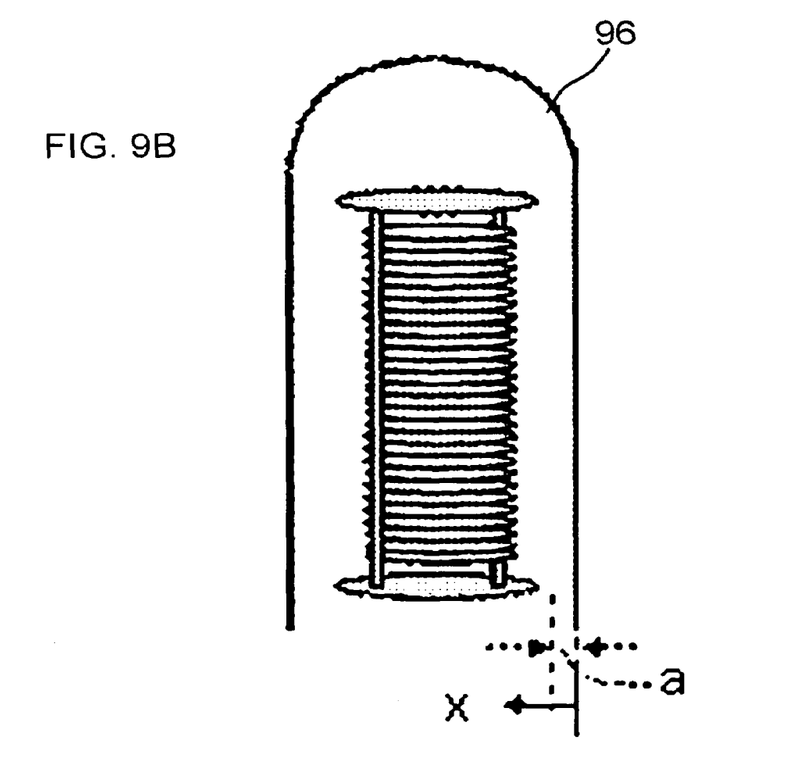

FIGS. 8A and 8B are graphs, showing a difference in the surface nitrogen concentration which is generating from a difference in the nitrogen concentration before the $NH_3$ annealing. In FIGS. 8A and 8B, the ordinates in respective graphs represent nitrogen concentration (in arbitrary scaling). Further, the abscissas x represent a distance from a surface (back surface) of a facing wafer 94 disposed to face the wafer to be processed 92 or a distance from an interior wall of a reaction chamber 96, which are shown in FIG. 9A and FIG. 9B. Point "a" located on the abscissa represents a film thickness of a HfSiO film deposited on the facing wafer 94 and on the interior wall of the reaction chamber 96. The graphs of the upper side in both of FIG. 8A and FIG. 8B represent nitrogen concentration in films before the annealing and the graphs of the lower side represent nitrogen concentration in films after the annealing, and both show nitrogen profiles in the HfSiO film (solid line). Further, saturation points in the nitrogen concentration are indicated by dotted lines.

First of all, reasons for the fact that the $NH_3$ annealing shortly before the deposition is not effective is described. As shown in FIG. 8A, when the nitrogen concentrations on the interior wall of the reaction chamber and on the facing wafer are high, the nitrogen concentrations on the surfaces may saturate shortly after the $NH_3$ annealing and thus the nitrogen concentrations are high. On the contrary, as shown in FIG. 8B, when the nitrogen concentrations on the interior wall of the of reaction chamber and on the facing wafer just before the $NH_3$ annealing are low, the nitrogen concentration on the surface after the $NH_3$ annealing is lower and does not reach the saturated concentration. That is, the surface nitrogen concentrations considerably depend upon the nitrogen concentrations on the interior wall of the of reaction chamber and on the facing wafer just before the $NH_3$ annealing process.

Figure 10:
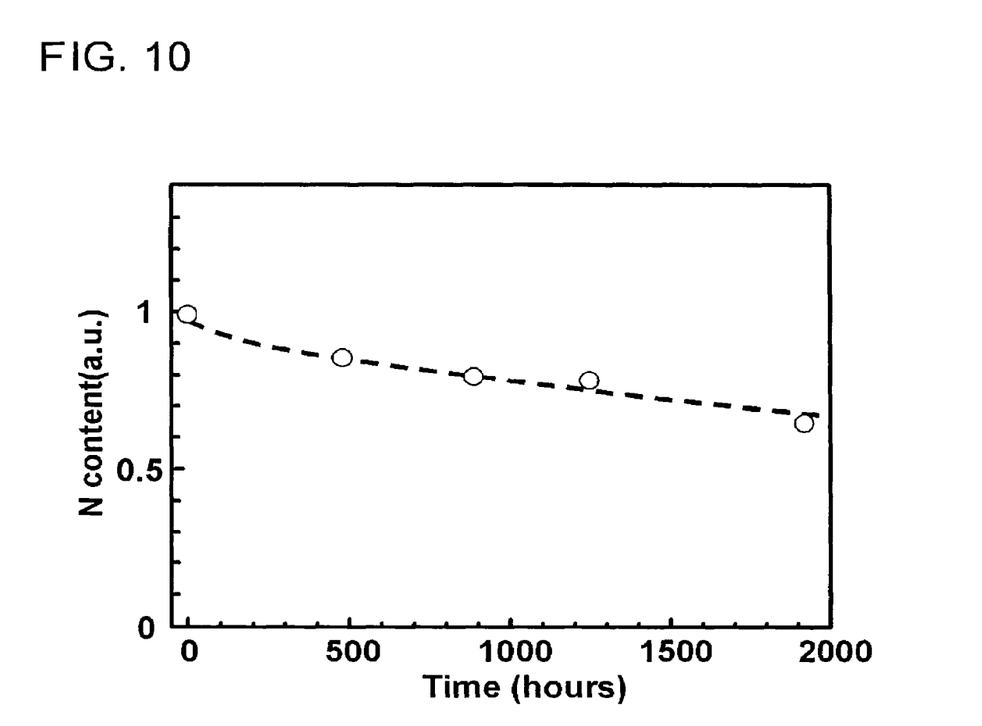
FIG. 10 is a graph, showing a relationship between time of leaving the film after the $NH_3$ annealing and the nitrogen concentration.

Next, reasons for the fact that maintaining the pressure within the reaction chamber at an atmospheric pressure is not effective is described. FIG. 10 is a graph, showing a relationship between time of leaving the film within the atmospheric air after the $NH_3$ annealing and the nitrogen concentration measured by an x-ray photoelectron spectroscopy (XPS). The ordinate represents the nitrogen concentration (in arbitrary scaling) and the abscissa represents the time of leaving (hour). It can be understood from the graph that, when the HfSiON film is left in the atmospheric air, the nitrogen concentration in the film is decreased as time advances. Therefore, it is also predicted that, when the interior of the reaction chamber is maintained at the atmospheric pressure, the nitrogen concentrations in the HfSiON films adhered on the interior wall of the reaction chamber and the facing wafer are also decreased as time advances, leading to increasing the variation in the film thickness.

By summarizing the above-described discussions, it can be understood that each of two approaches described in the patent document 1, namely compensating the material eliminated before the product processing by directly supplying the material and annealing thereof, and maintaining the pressure at an atmospheric pressure during the stand-by to reduce the variation in the film thickness, is not suitable for reducing the variation in the film thickness in the process for depositing HfSiON films.

According to the present invention, there is provided a method for depositing a film, including: (a) processing a wafer, including forming a high dielectric constant film on a first wafer; and nitriding the high dielectric constant film formed on the first wafer; and (b) performing coating process including forming a high dielectric constant film on a second wafer; and nitriding the high dielectric constant film formed on the second wafer, wherein the processing the wafer and the coating process are carried out in the same reaction chamber, and wherein the coating process is carried out before the processing the wafer.

In such deposition method, the coating process is carried out before processing the wafer. In such coating process, deposition of a film and nitridation are successively performed for the second wafer (referred to as a non-product wafer: NPW) that is different from the first wafer (referred to as a product wafer), which is an object to be processed. The wafer processing is performed after such coating process, so that the surface nitrogen concentrations on the interior wall of the reaction chamber and the facing wafer shortly before the wafer processing can be controlled to be constant. Thus, variation in the film thickness can be inhibited.

Here, the high dielectric constant film is a film having a dielectric constant higher than that of the silicon dioxide film. The high dielectric constant film is preferably composed of a material having a dielectric constant of not lower than 10. Typical high dielectric constant films include, for example, an oxide film or a silicate film containing one or more chemical element selected from a group consisting of hafnium (Hf), zirconium (Zr) and lanthanides.

According to the present invention, there is also provided a method for manufacturing a semiconductor device, including: depositing a high dielectric constant film containing nitrogen by employing the above-described method for depositing the film. Since the above-described deposition method is employed, a semiconductor device having the high dielectric constant film that exhibits a reduced variation in the film thickness is obtained.

According to the present invention, a method for depositing a film that provides a reduced variation in thickness of various types of high dielectric constant films including a HfSiON film and a method for manufacturing a semiconductor device employing thereof are achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferable embodiments of methods for depositing films and methods for manufacturing semiconductor devices according to the present invention will be described as follows in further detail, in reference to the annexed figures. In all figures, identical numeral is assigned to an element commonly appeared in the figures, and the detailed description thereof will not be repeated.

A method for depositing a film according to an embodiment of the present invention includes following steps (a) and (b). In the mean time, these steps (a) and (b) are carried out in the same reaction chamber. Further, the step (b) is carried out before the step (a). The high dielectric constant film deposited in the present embodiment is a HfSiON film.

(a): A wafer processing step including a first film-forming step for forming a film of a high dielectric constant material (HfSiO film) on a wafer (hereinafter, referred to as "product wafer"); and a first nitridation step for achieving nitridation of the HfSiO film formed on the product wafer.

(b): A coating process step including a second film-forming step for forming a HfSiO film on a NPW and on an interior wall of a reaction chamber; and a second nitridation step for achieving nitridation of the HfSiO films formed on the NPW and on the interior wall of the reaction chamber.

Here, in the second film-forming step, it is preferable to form the HfSiO film having a thickness of not thinner than the diffusion length of nitrogen in the HfSiO film. The diffusion length mentioned here indicates a diffusion length at a temperature in the reaction chamber during the second nitridation step. Further, it is preferable that the step (a) is started within 24 hours after the end of the step (b). Further, it is preferable that the first film-forming step is performed under a condition that the product wafers are disposed to face to the NPW. This NPW is a wafer treated in the coating process step.

Further, the method for manufacturing the semiconductor device according to an embodiment of the present invention includes depositing a high dielectric constant film containing nitrogen by employing the above-described method for a depositing film.

Subsequently, advantageous effects obtainable by employing the configuration of the present embodiment will be described. In the present embodiment, the coating run step is performed before conducting the wafer processing step. In such coating process step, the film-forming step and the nitridation step are successively performed for the NPW and the interior wall of the reaction chamber. The wafer processing is performed after such coating process, so that the surface nitrogen concentrations on the interior wall of the reaction chamber and the facing wafer just before the wafer processing can be controlled to be constant. Thus, variation in the film thickness can be inhibited.

When the HfSiO film having a thickness of not thinner than the above-described diffusion length is formed in the second film-forming step, the variation in the film thickness can be more effectively inhibited, as indicated in an example discussed later.

In the present embodiment, the HfSiON film is deposited as the high dielectric constant film. The HfSiON film satisfies two benefits of exhibiting lower reactivity with the gate electrode, and not allowing crystallization even in the high-temperature annealing as described above, when the film is employed as a gate insulating film. Moreover, HfSiON is a material suitable for a practical use. Therefore, it is critical to reproducibly deposit the HfSiON film, and the present invention that can provide a reduced variation in the film thickness is particularly useful.

If the wafer processing is started within 24 hours after the end of the coating process, the variation in the film thickness can be further effectively reduced.

If the product wafers are disposed to face to the NPW, the variation in the film thickness can be further effectively reduced.

Further, since the above-described deposition method is employed in the method for manufacturing the semiconductor device according to this embodiment, a semiconductor device having the high dielectric constant film that exhibits a reduced variation in the film thickness is obtained. Thus, the manufacturing process suitable for obtaining the semiconductor device that exhibits an improved reliability is achieved.

WORKING EXAMPLE

Figure 1:
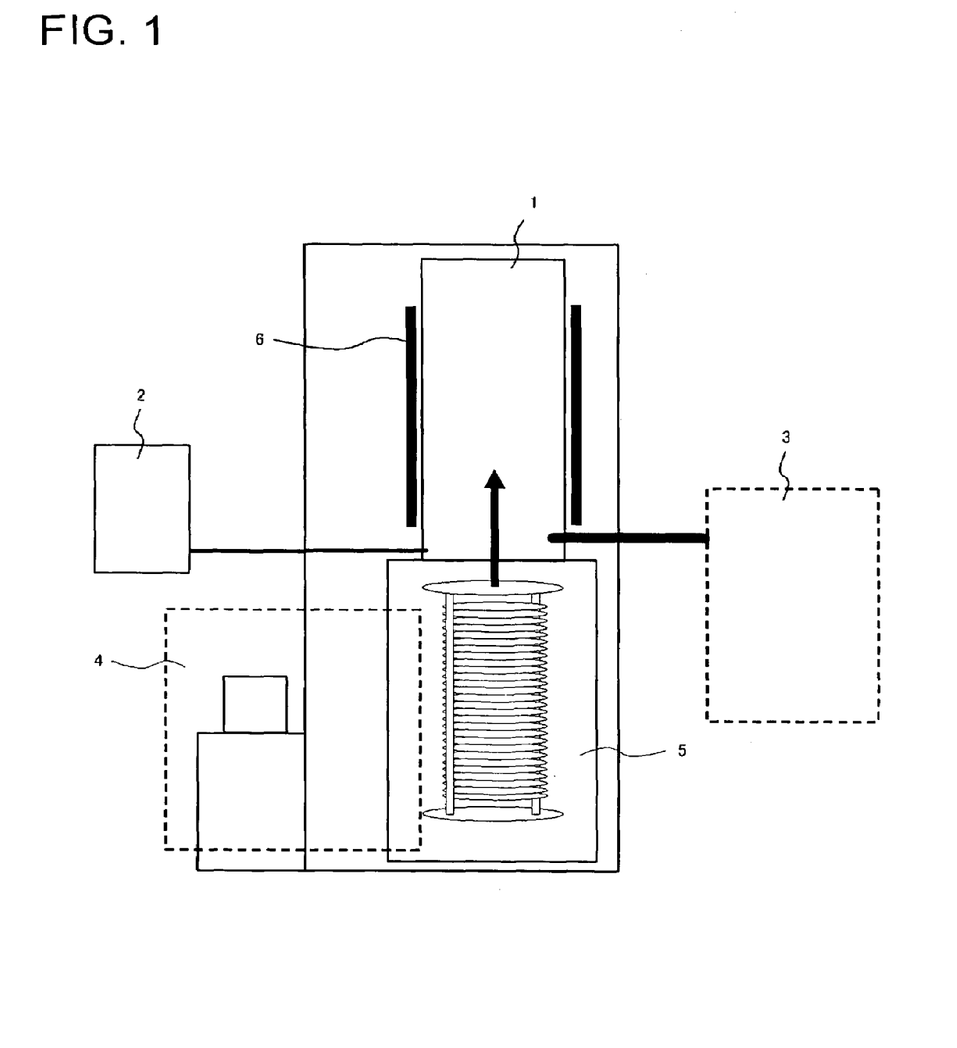
FIG. 1 is a schematic diagram, showing a batch CVD apparatus of employed in an example according to the present invention.

FIG. 1 is a schematic diagram, illustrating a batch CVD apparatus employed in this example. This apparatus includes a reaction chamber 1 for performing a deposition of thin films on wafers under a reduced pressure, a gas supplying system 2 for supplying reactive gases or the like into the reaction chamber 1, an exhaust system 3 for exhausting gases contained in the reaction chamber 1, and a transfer system 4 for transferring wafers. Further, in order to prevent a swirl of atmospheric air, this apparatus includes a load lock chamber 5 to load the wafers in the reaction chamber 1. Heating of a wafer in the reaction chamber 1 is performed by utilizing a radiant heat from a heater 6 surrounding the reaction chamber 1.

Figure 2:
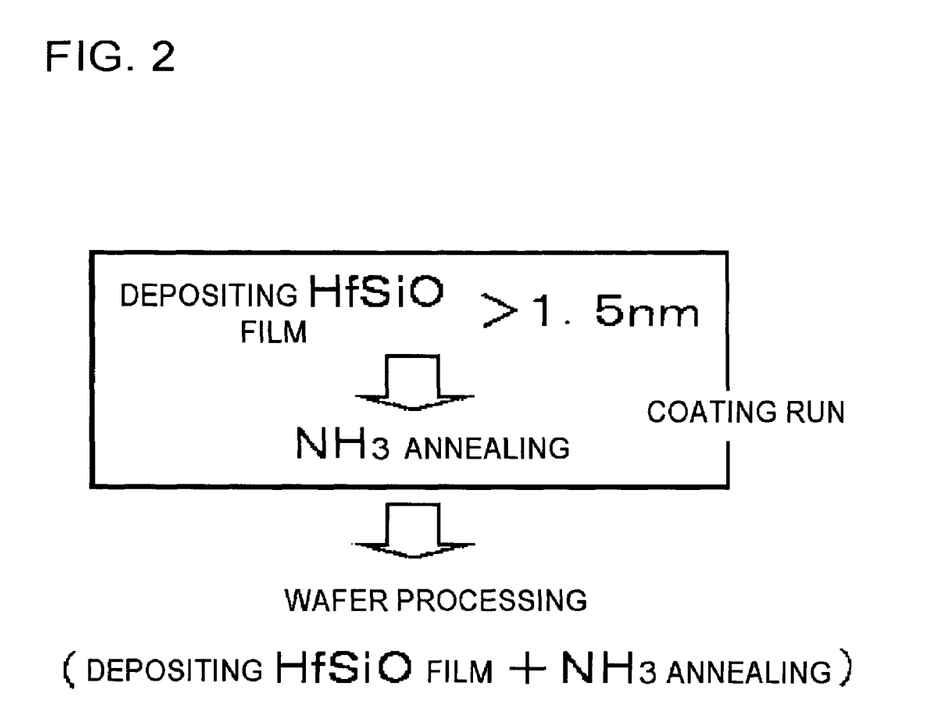
FIG. 2 is a schematic diagram, showing a deposition flow in the example.

FIG. 2 shows a flow of the deposition process of this example. First of all, the coating process step was performed as follows. In this step, only the NPW was loaded into the chamber and the product wafer was not loaded. The NPW was inserted into a boat in the load lock chamber 5 by the transfer system 4. The boat was lifted up to an internal of the reaction chamber 1, so that the NPW was disposed in a predetermined location in the reaction chamber 1. In such condition, deposition of a HfSiO film was performed. After that, an $NH_3$ annealing was carried out in the same batch.

In that case, conditions of deposition of the HfSiO film were selected as follows.
Film thickness: approximately 1.5 nm
Temperature: 200 to 300 degree C.
Reactive gases: HTB (hafnium tertiarybutoxy: $Hf(O\text{-}tC_4H_9)_4$) and $Si_2H_6$ Further, conditions of $NH_3$ annealing were selected as follows.
Temperature: 700 to 800 degree C.
Processing time: 10 to 60 minutes After the coating process step was completed, boat was lifted down from the reaction chamber 1 to the load lock chamber 5, and then was returned to the carrier by the transfer system 4. Sequentially, the product wafer and the above-described NPW were inserted into the boat in the load lock chamber 5 by the transfer system 4. Thereafter, the boat was lifted up to the interior of the reaction chamber 1, where the deposition of HfSiO and the $NH_3$ annealing were successively performed within the reaction chamber 1, so that the deposition of the HfSiON film was performed. In this case, the above-described NPW was employed as a facing wafer. This configuration could eliminate the stand-by time from the coating run to the deposition of the product wafer, or even if it was assumed that there was, the stand-by time was only the duration time related to the transfer of the wafer.

Figure 3A:
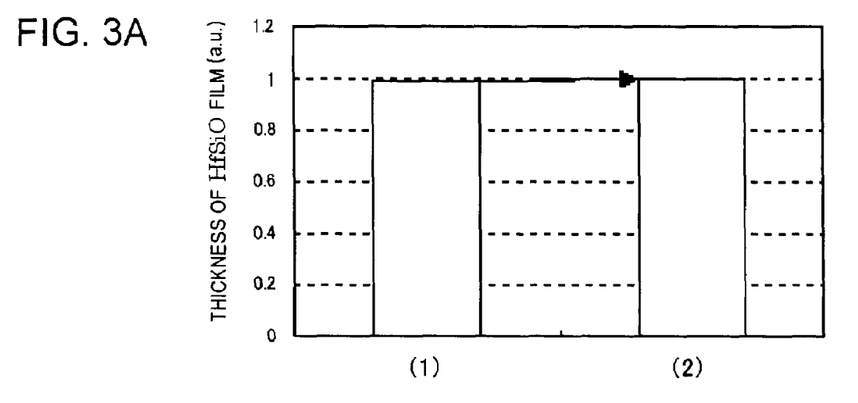
FIGS. 3A and 3B are graphs, useful in presenting a preferable film thickness of a HfSiO film formed in the second film-forming step.
Figure 3B:
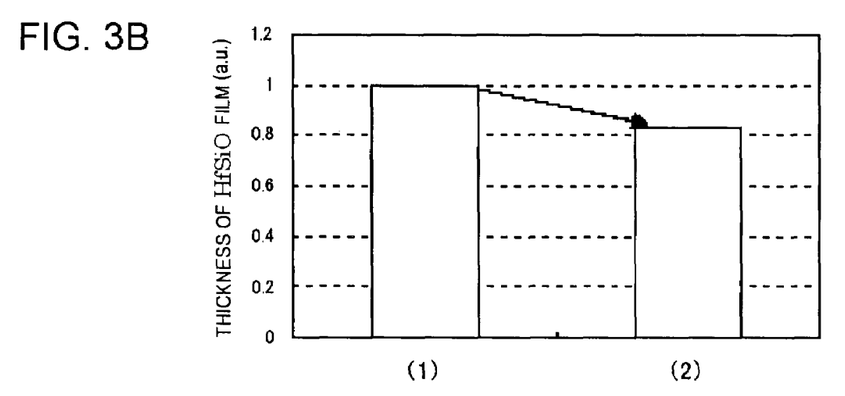

Preferable film thickness of the HfSiO film formed in the second film-forming step will be described in reference to FIGS. 3A and 3B. Bar graphs (1) and (2) of FIGS. 3A and 3B indicate film thickness deposited before and after the coating run respectively, under the same condition. FIGS. 3A and 3B correspond to cases of depositing HfSiO films formed in the second film-forming step having the thickness of about 1.5 nm and about 0.7 nm, respectively. The ordinates represent the film thickness (in arbitrary scaling).

It can be understood from these graphs that the variation in the film thickness is thinner in the case of having the film thickness of 1.5 nm than the case of having the film thickness of 0.7 nm.

Figure 4A:
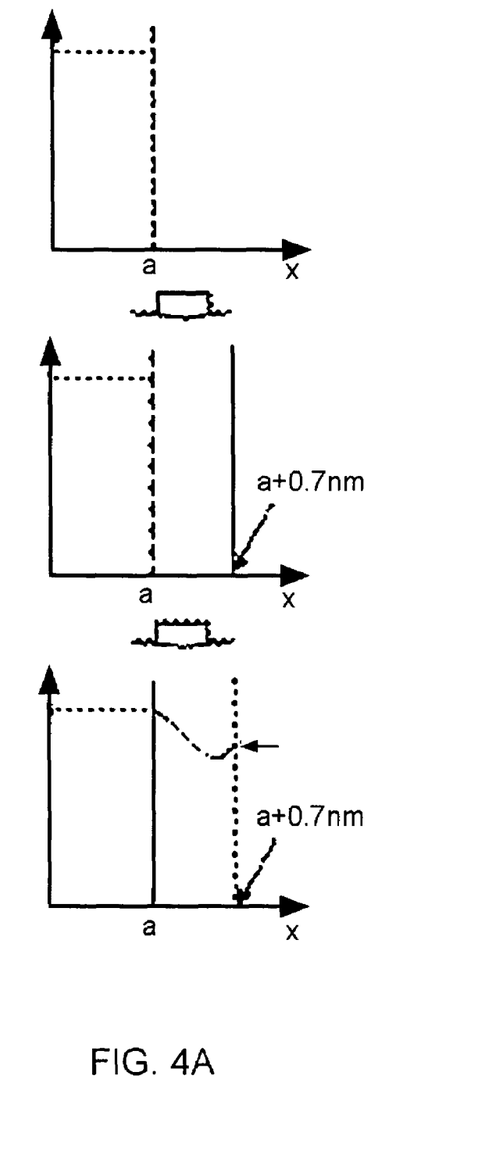
FIGS. 4A and 4B are graphs, useful in presenting a preferable film thickness of a HfSiO film formed in the second film-forming step.
Figure 4B:
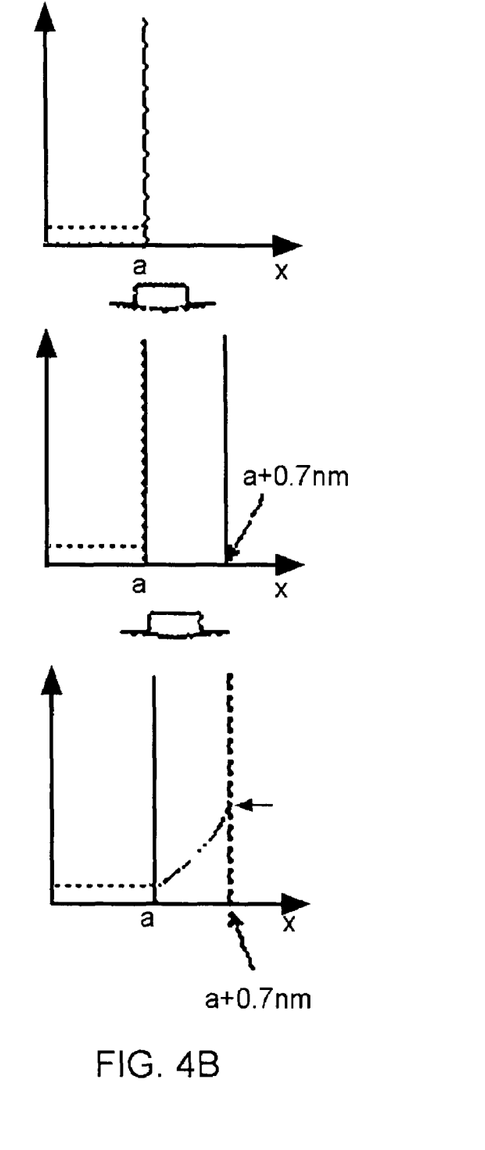
Figure 5A:
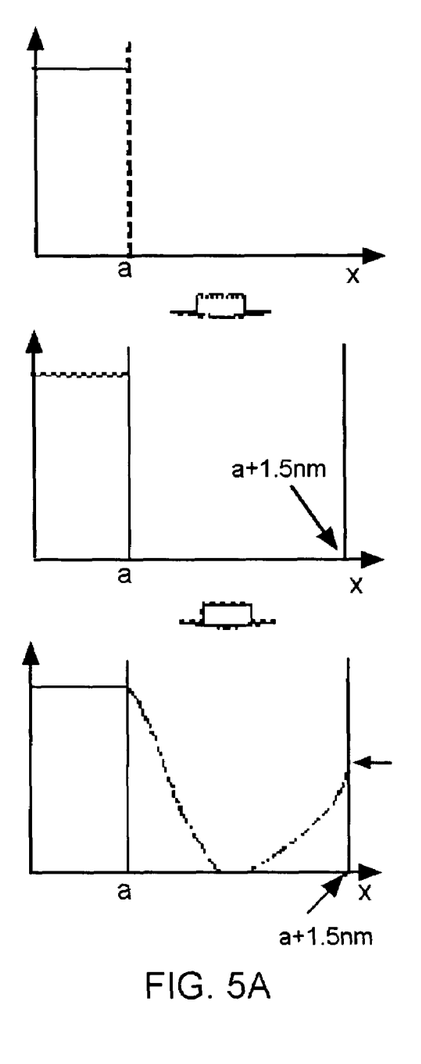
FIGS. 5A and 5B are graphs, useful in presenting a preferable film thickness of a HfSiO film formed in the second film-forming step.
Figure 5B:
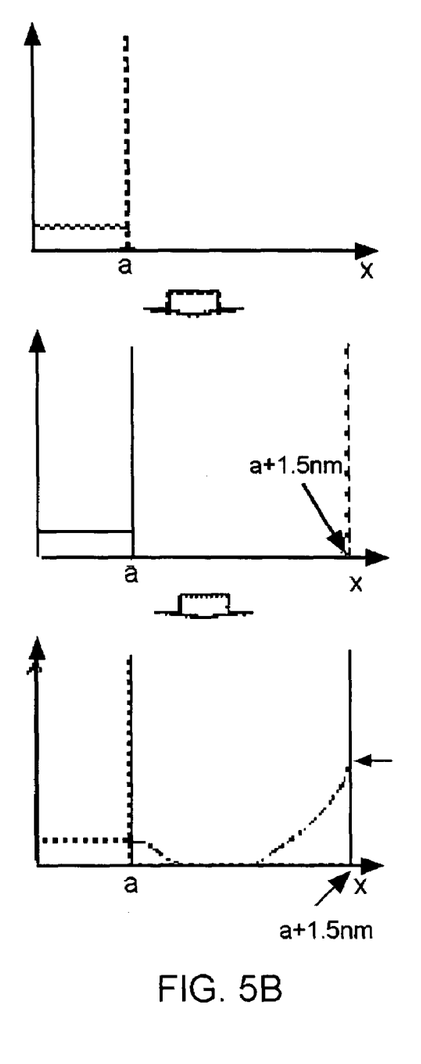

FIGS. 4A, 4B, 5A and 5B are graphs, showing profiles of nitrogen concentration in the HfSiO films. FIGS. 4A and 4B represent the case of coating deposition of a film having the thickness of 0.7 nm. FIGS. 5A and 5B represent the case of coating deposition of a film having the thickness of 1.5 nm. The meanings of ordinates and abscissas of respective graphs are the same as those of FIGS. 8A and 8B. Further, the upper graph, the middle graph, and the bottom graph thereof shows conditions of the films before the coating process, just after the coating deposition, and just after the nitridation subsequent to the coating deposition, respectively.

The reason that the variation in the film thickness is thinner in the case of having the film thickness of 1.5 nm than the case of having the film thickness of 0.7 nm, in reference to these graphs of FIGS. 4A, 4B, 5A and 5B. In the coating run process for the film having the thickness of about 0.7 nm, nitrogen introduced by the $NH_3$ annealing diffuses to a base underlying the HfSiO film. Thus, if the nitrogen concentration in the base is high as shown in FIG. 4A, the nitrogen concentration of the surface of the HfSiO film is increased. On the contrary, when the nitrogen concentration in the base is low as shown in FIG. 4B, the nitrogen concentration of the surface of the HfSiO film is maintained to be low. That is, when the coating process for the film having the thickness of about 0.7 nm, the nitrogen concentration of surface depends on the nitrogen concentration before the coating process in any way.

On the other hand, as can be seen from graphs of FIGS. 5A and 5B, when the coating process for the film having the thickness of about 1.5 nm is performed, nitrogen introduced in the coating process cannot diffuse sufficiently to the deeper portion of the film. Therefore, nitrogen concentration after the coating is maintained to be constant, regardless of the level of nitrogen quantity in the underlying base. FIGS. 5A and 5B show the profiles of nitrogen concentration in the cases of exhibiting higher and lower nitrogen concentrations in the underlying base, respectively.

As described above, it is understood that equivalent nitrogen concentrations of surfaces can be provided by employing the process, in which HfSiO is deposited to form the HfSiO film having a thickness of not thinner than the diffusion length of nitrogen in HfSiO and then the deposited HfSiO film is annealed in $NH_3$. Preferable film thickness of the HfSiO film depends upon the nature of the nitridation process, and is determined by a diffusion length of nitrogen at a certain temperature. For example, the film thickness of the formed HfSiO film is around 1.0 nm at a temperature of 700 to 750 degree C., and around 1.5 nm at a temperature of 750 to 800 degree C.

Further, elimination of nitrogen from the HfSiON film during the stand-by time can be prevented by reducing the time interval from the completion of the coating process step to the beginning of the wafer processing step as much as possible. Further, it is considered that, if the above-described time intervals are maintained to be constant, constant nitrogen concentration of the surface is provided even if elimination of nitrogen is generated, so that the stable deposition processes are achieved.

It is not intended that the methods for depositing the films and the methods for manufacturing the semiconductor devices according to the present invention is limited to the configurations illustrated in the above-described embodiment, and various modifications thereof are available. For example, while the exemplary implementations of depositing the HfSiON film has been illustrated in the above-described embodiments, a high dielectric constant film other than HfSiON film may also be employed as the deposited high dielectric constant film, provided that the film contains nitrogen.

It is not necessary that the facing wafer is provided for each of the product wafers. For example, the facing wafer may be provided for every other product wafer. Also, only one facing wafer may be provided for a plurality of the product wafers.

It is apparent that the present invention is not limited to the above embodiment, and may be modified and changed without departing from the scope and spirit of the invention.

What is claimed is:

1. A method for depositing a film, comprising:
    performing a coating process, including:
        forming a high dielectric constant film on a first wafer and a reaction chamber wall; and
        nitriding said high dielectric constant film formed on said first wafer and said reaction chamber wall to form a nitrided high dielectric film; and
    processing a second wafer in said reaction chamber where said chamber wall surface is covered with said nitrided high dielectric film, and the nitrided high dielectric film on said chamber wall is exposed, said processing including:
        forming another high dielectric film on said second wafer; and
        nitriding said another high dielectric constant film formed on said second wafer.

2. The method according to claim 1, wherein, in said forming the high dielectric constant film on said first wafer, said high dielectric constant film is formed to have a thickness of not thinner than a diffusion length of nitrogen in said high dielectric constant film at a temperature of said nitridation of said high dielectric constant film formed on said first wafer.

3. The method according to claim 1, wherein said high dielectric constant film is a HfSiO film.

4. The method according to claim 1, wherein said processing the wafer is started within 24 hours after completing said coating process.

5. The method according to claim 1, wherein said forming the another high dielectric constant film on the second wafer is performed while said second wafer is disposed to face to said first wafer.

6. The method according to claim 5, wherein said first wafer comprises a non-product wafer and said second wafer comprises a product wafer.

7. The method according to claim 1, wherein said another high dielectric constant film comprises an HfSiO film.

8. The method according to claim 1, wherein said first wafer comprises a non-product wafer and said second wafer comprises a product wafer.

9. A method for manufacturing a semiconductor device, comprising:
    depositing a high dielectric constant film containing nitrogen, said depositing comprising:
    performing a coating process, including:
        forming a high dielectric constant film on a first wafer and a reaction chamber wall; and
        nitriding said high dielectric constant film formed on said first wafer and said reaction chamber wall to form a nitrided high dielectric film; and
    processing a second wafer in said reaction chamber where said chamber wall surface is covered with said nitrided high dielectric film, and the nitrided high dielectric film on said chamber wall is exposed, said processing including:
        forming another high dielectric constant film on said second wafer; and
        nitriding said another high dielectric constant film formed on said second wafer.

10. The method according to claim 9, wherein, in said forming the high dielectric constant film on said second wafer, said high dielectric constant film is formed to have a thickness of not thinner than a diffusion length of nitrogen in said high dielectric constant film at a temperature of said nitridation of said another high dielectric constant film formed on said second wafer.

11. The method according to claim 9, wherein said high dielectric constant film comprises an HfSiO film.

12. The method according to claim 9, wherein said processing the wafer is started within 24 hours after completing said coating process.

13. The method according to claim 9, wherein said forming the another high dielectric constant film on the second wafer is performed while said second wafer is disposed to face to said first wafer.

14. The method according to claim 13, wherein said first wafer comprises a non-product wafer and said second wafer comprises a product wafer.

15. The method according to claim 9, wherein said another high dielectric constant film comprises an HfSiO film.

16. The method according to claim 9, wherein said first wafer comprises a non-product wafer and said second wafer comprises a product wafer.

17. A method for depositing a film, comprising:
performing a coating process, including:
   forming a high dielectric constant film on a non-product wafer and a reaction chamber wall; and
   nitriding said high dielectric constant film formed on said non-product wafer and said reaction chamber wall to form a nitrided high dielectric film; and
processing a product wafer in said reaction chamber where said chamber wall surface is covered with said nitrided high dielectric film, and the nitrided high dielectric film on said chamber wall is exposed, said processing including:
   forming another high dielectric constant film on said product wafer; and
   nitriding said another high dielectric constant film formed on said product wafer,
wherein said processing said product wafer is performed while said product wafer is disposed to face to said non-product wafer.

18. The method according to claim 17, wherein said high dielectric constant film and said high dielectric constant film both comprise a same material.

19. The method according to claim 18, wherein said material comprises HfSiO.

* * * * *